United States Patent
Park et al.

(10) Patent No.: US 11,372,332 B2
(45) Date of Patent: Jun. 28, 2022

(54) PLASMA TREATMENT METHOD TO IMPROVE PHOTO RESIST ROUGHNESS AND REMOVE PHOTO RESIST SCUM

(71) Applicant: Tokyo Electron Limited, Tokyo (JP)

(72) Inventors: Wan Jae Park, Albany, NY (US); Akiteru Ko, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 199 days.

(21) Appl. No.: 16/594,951

(22) Filed: Oct. 7, 2019

(65) Prior Publication Data

US 2020/0133133 A1 Apr. 30, 2020

Related U.S. Application Data

(60) Provisional application No. 62/751,357, filed on Oct. 26, 2018, provisional application No. 62/774,563, filed on Dec. 3, 2018.

(51) Int. Cl.
*G03F 7/42* (2006.01)
*G03F 7/20* (2006.01)
*H01L 21/027* (2006.01)

(52) U.S. Cl.
CPC ............ *G03F 7/427* (2013.01); *G03F 7/2004* (2013.01); *G03F 7/2006* (2013.01); *H01L 21/0273* (2013.01)

(58) Field of Classification Search
CPC ....... G03F 7/427; G03F 7/2004; G03F 7/2006
See application file for complete search history.

(56) References Cited

U.S. PATENT DOCUMENTS

| | | | |
|---|---|---|---|
| 2008/0182419 A1* | 7/2008 | Yasui | H01L 21/32139 438/710 |
| 2011/0143170 A1* | 6/2011 | Gouk | G11B 5/855 428/846 |

* cited by examiner

*Primary Examiner* — Daborah Chacko-Davis
(74) *Attorney, Agent, or Firm* — Weihrouch IP

(57) ABSTRACT

A patterned photo resist layer (for example an EUV photo resist layer), which may exhibit line width roughness (LWR) and line edge roughness (LER) or scum is treated with a plasma treatment before subsequent etching processes. The plasma treatment reduces LWR, LER, and/or photo resist scum. In one exemplary embodiment, the plasma treatment may include a plasma formed using a gas having a boron and halogen compound. In one embodiment, the gas compound may be a boron and chlorine compound, for example boron trichloride ($BCl_3$) gas. In another embodiment, the gas compound may be a boron and fluorine compound, for example $B_xF_y$ gases. The plasma treatment process may modify the photoresist surface to improve LWR, LER, and scum effects by removing roughness from the photo resist surface and removing photo resist residues which may case scumming.

8 Claims, 7 Drawing Sheets

PLASMA TREATMENT METHOD TO IMPROVE PHOTO RESIST ROUGHNESS AND REMOVE PHOTO RESIST SCUM

This application claims priority to U.S. Provisional Patent Application No. 62/751,357, entitled, "Plasma Treatment Method to Improve Photo Resist Roughness And Remove Photo Resist Scum" filed Oct. 26, 2018; the disclosure of which is expressly incorporated herein, in its entirety, by reference.

BACKGROUND

The present disclosure relates to the processing of substrates, such as for example, semiconductor substrates. In particular, it provides a novel method to pattern substrates utilizing very narrow pitch techniques, such for example, used in extreme ultraviolet (EUV) lithography, multiple patterning schemes (such as self-aligned double patterning (SADP), self-aligned triple patterning (SATP), self-aligned quadruple patterning (SAQP), etc.), argon fluoride (ArF) lithography, or other narrow pitch patterning methods.

As geometries in substrate processing continue to shrink, the technical challenges to forming structures on substrates via photolithography techniques increase. As requirements for lower pitch structures arose, a variety of photolithography techniques have been utilized for achieving suitable photolithography for such narrow pitches including EUV lithography (lithography utilizing wavelengths of light in the EUV range, most typically 13.5 nm wavelengths), multiple patterning schemes, ArF lithography, patterning schemes which utilize etch trim steps, etc.

It has been found that as pitches and dimensions decrease, the line width roughness (LWR) and line edge roughness (LER) performance degrades during the pattern transfer process. Further, the formation of photo resist scum in areas which the photo resist should have been removed also increases. Thus, as the feature size is reduced, the LWR and LER have become recognized as a critical concern. Further photo resist scum concerns have increased. The effects of LWR, LER and scumming have become particularly problematic with EUV and ArF lithography.

For example, FIGS. 1A and 1B illustrate top views of a portion of a patterned substrate having degraded EUV photo resist lines. As shown in these figures, LWR/LER degradation of a conventional process is illustrated by the degraded lines having "wiggle" and rough edges in a pattern transferred to the photo resist. Further, scum may be formed between lines which may lead to pattern bridges. For example, as shown in FIG. 1A, the patterned lines 102 illustrate large LWR. As shown in FIG. 1B, the patterned lines 106 illustrate large LER and areas of scum 106 between the patterned lines 104.

It would be desirable to provide a lithography technique that reduces LWR, LER, and/or reduces photo resist scum.

SUMMARY

Described herein is an innovative method to perform photo lithography pattern transfer. A substrate is provided with a patterned layer, such as for example, a photo resist layer, which may exhibit LWR, LER, and/or scum. In one exemplary embodiment, the patterned layer may be an EUV photo resist layer. In the method disclosed, after the photo resist layer is patterned (for example a developed photo resist layer), a plasma treatment is provided before subsequent etching processes and the plasma treatment reduces LWR, LER, and/or photo resist scum. In one exemplary embodiment, the plasma treatment may include a plasma formed using a gas having a boron and halogen compound. In one embodiment, the gas compound may be a boron and chlorine compound. In one exemplary embodiment, the plasma used to treat the patterned photo resist may comprise a plasma formed with the use of boron trichloride ($BCl_3$) gas. In another embodiment, the gas compound may be a boron and fluorine compound, for example $B_xF_y$ gases. In yet another embodiment, the plasma may be formed with a boron gas. The plasma treatment process may modify the photoresist surface to improve LWR, LER, and scum effects by removing roughness from the photo resist surface and removing photo resist residues which may cause scumming.

In one embodiment, a method for processing a substrate is disclosed. The method may comprise providing the substrate with at least one underlying layer and providing the substrate with a patterned photo resist layer overlying the underlying layer. The method further comprises treating the photo resist layer with a plasma to improve line width roughness, line edge roughness and/or scum characteristics of the patterned photo resist layer, wherein the plasma is formed using at least a gas comprising boron.

In another embodiment, a method for processing a substrate is disclosed. The method may comprise providing the substrate with at least one underlying layer, the underlying layer being an etch target layer and providing the substrate with a patterned extreme ultraviolet (EUV) photo resist layer overlying the underlying layer. The method further comprises treating the photo resist layer with a plasma to improve line width roughness and/or line edge roughness characteristics of the patterned photo resist layer by reducing the line width roughness or line edge roughness by at least 30%, wherein the plasma is formed using at least a gas comprised of boron and a halogen.

In yet another embodiment, a method for processing a substrate is disclosed. The method may comprise providing the substrate with at least one underlying layer, the underlying layer being an etch target layer and providing the substrate with a patterned extreme ultraviolet (EUV) photo resist layer overlying the underlying layer. The method further comprises providing at least one additional layer between the underlying layer and the patterned extreme ultraviolet (EUV) photo resist layer. The method further comprises treating the photo resist layer with a plasma to improve line width roughness, line edge roughness and/or scum characteristics of the patterned photo resist layer, wherein the plasma is formed using at least a boron trichloride ($BCl_3$) gas.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Described herein is an innovative method to perform photo lithography pattern transfer. A substrate is provided with a patterned layer, such as for example, a photo resist layer, which may exhibit LWR, LER, or scum. In one exemplary embodiment, the patterned layer may be an EUV photo resist layer. In the method disclosed, after the photo resist layer is patterned (for example a developed photo resist layer), a plasma treatment is provided before subsequent etching processes and the plasma treatment reduces LWR, LER, and/or photo resist scum. In one exemplary embodiment, the plasma treatment may include a plasma formed using a gas having a boron and halogen compound. In one embodiment, the gas compound may be a boron and chlorine compound. In one exemplary embodiment, the plasma used to treat the patterned photo resist may comprise a plasma formed with the use of boron trichloride ($BCl_3$) gas. In another embodiment, the gas compound may be a boron and fluorine compound, for example $B_xF_y$ gases. In yet another embodiment, the plasma may be formed with a boron gas. The plasma treatment process may modify the photoresist surface to improve LWR, LER, and scum effects by removing roughness from the photo resist surface and removing photo resist residues which may cause scumming.

Figure 1A:
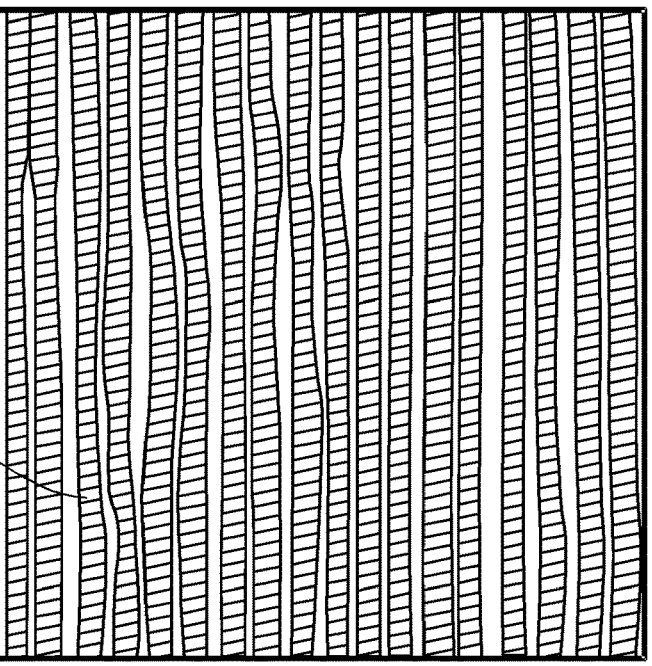
FIG. 1A illustrates prior art examples of LWR of a patterned layer.
Figure 1B:
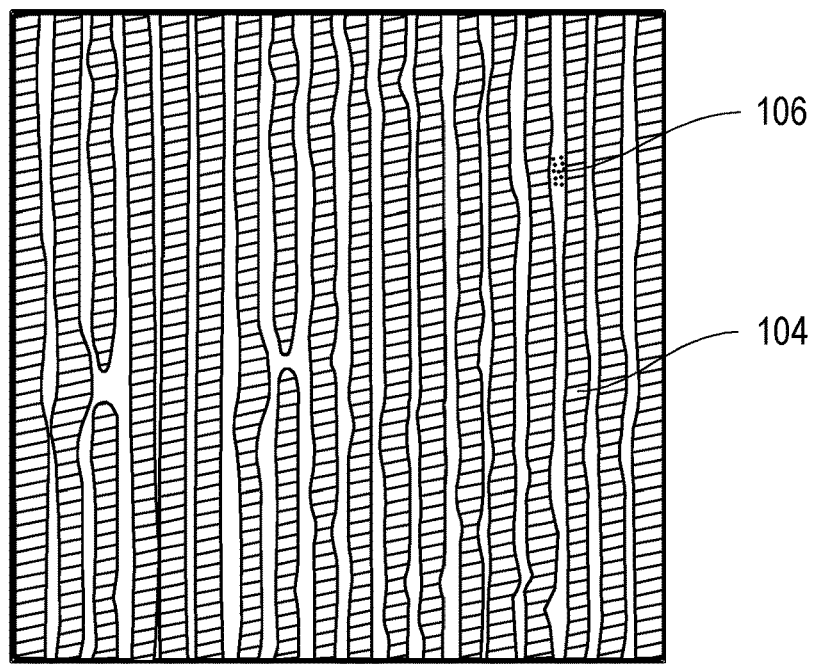
FIG. 1B illustrates prior art examples of LER and scum of a patterned layer.
Figure 2A:
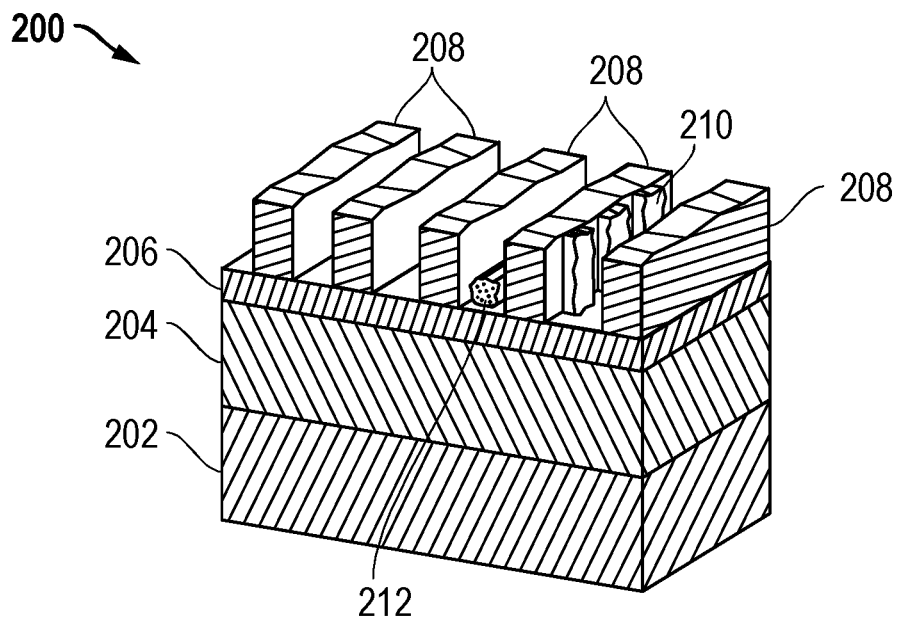
FIG. 2A illustrates an exemplary patterned photo resist layer before plasma treatment of the photo resist.
Figure 2B:
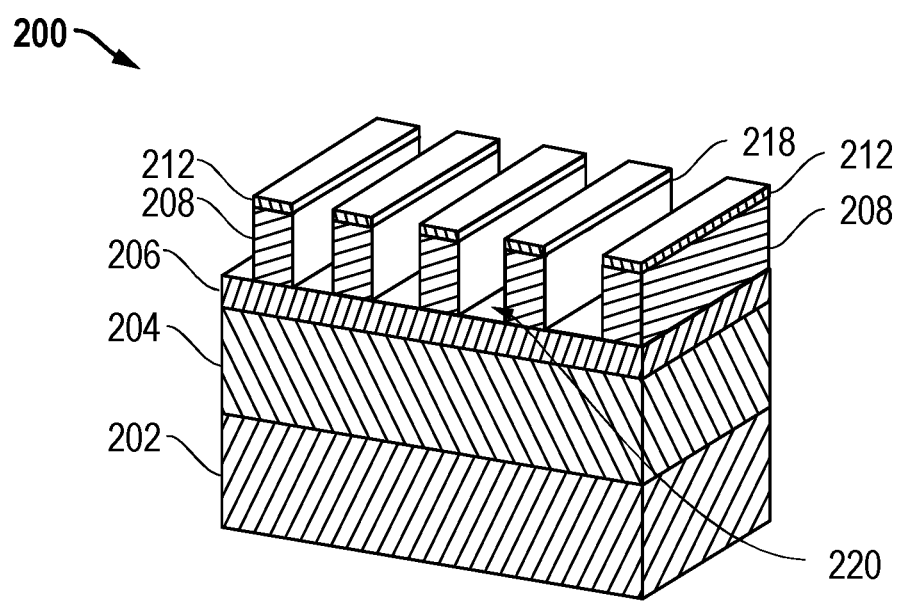
FIG. 2B illustrates an exemplary patterned photo resist layer after the photo resist plasma treatment as described herein.

An exemplary embodiment of a method utilizing the techniques described herein may be seen with respect to FIGS. 2A and 2B. As shown in FIG. 2A, structure 200 is provided with a patterned photo resist layer which has patterned lines 208. Under the patterned photo resist a silicon antireflective (Si-ARC) layer 206 and spin on carbon (SOC) hard mask 204 may be provided. Various under layers 202 may be further provided, including a target etch layer for which it is desired to transfer the pattern of the photo resist to. As will be recognized by those skilled in the art, the layers shown in FIG. 2A are merely exemplary. For example, the layers shown may all form part of a substrate which may include many other patterned and unpatterned layers which are not shown. As shown in FIG. 2A, the photo resist layer may exhibit rough surface areas 210 on the surfaces of the patterned lines 208 and may exhibit photo resist scum 212 between the patterned lines 208.

Next, the structure 200 may be exposed to a plasma treatment process that is utilized to reduce the LWR, LER and/or photo resist scum. One exemplary plasma treatment may be a $BCl_3$ based plasma, however other plasmas may be utilized as described herein. FIG. 2B illustrates the structure 200 after the plasma treatment. As a result of the plasma treatment, the photo resist surfaces of the patterned lines 208 may be modified and smoothed and photo resist scum may be removed as shown by the smoothed surfaces 218 and the descummed areas 220 of FIG. 2B. Further, the surface of the patterned lines 208 of the photo resist layer may be modified as shown by modified surfaces 212.

Figure 3:
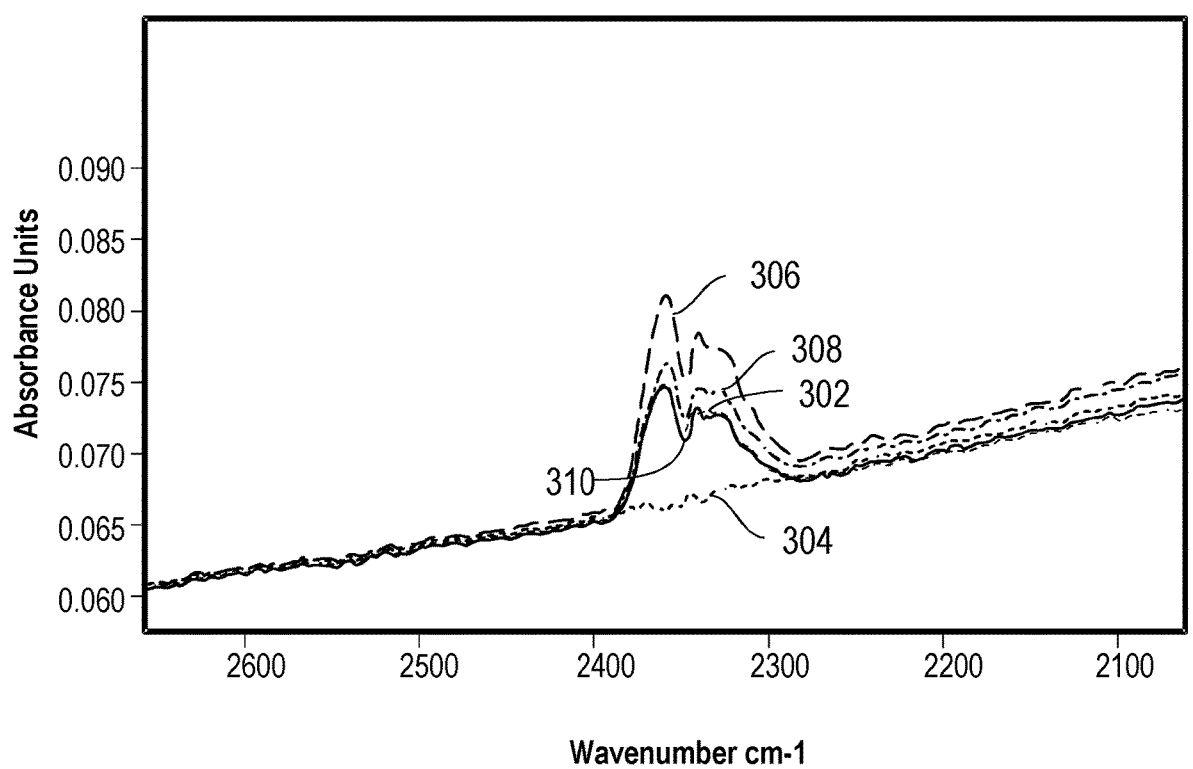
FIG. 3 illustrates a Fourier-transform infrared spectroscopy analysis of an EUV photo resist before plasma treatment and after various plasma treatments.

Exposure of the photo resist to the plasma treatment may modify the photo resist surface and change the photo resist surface chemical properties. For example, if the photo resist is composed mainly of carbonic bond such as carbon-carbon bonds and carbon-oxygen bonds, from the Fourier-transform infrared spectroscopy (FTIR) analysis, the inventors found that the carbonic bonds (around 2359, 2342 cm-1) disappeared after $BCl_3$ plasma treatment on EUV photo resist. For example, as shown in FIG. 3, FTIR results for an EUV photo resist surface with and without $BCl_3$ treatment are shown, along with comparing other plasma treatments. Plot 302 illustrates the FTIR results for the EUV photo resist surface if no plasma treatment is performed. Plot 304 illustrates the FTIR results for the EUV photo resist after treatment with a $BCl_3$ plasma. Plots 306, 308 and 310 illustrate the FTIR results after treatments with carbon tetrafluoride ($CF_4$), argon (AR) and hydrogen ($H_2$) plasmas respectively; (notice Plot 310 substantially overlaps with Plot 302).

Figure 4A:
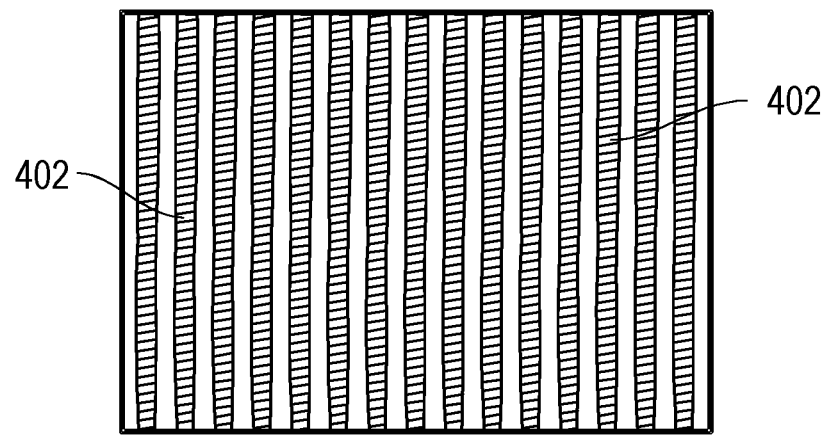
FIG. 4A illustrates the LWR/LER of an EUV photo resist pattern before plasma treatment.
Figure 4B:
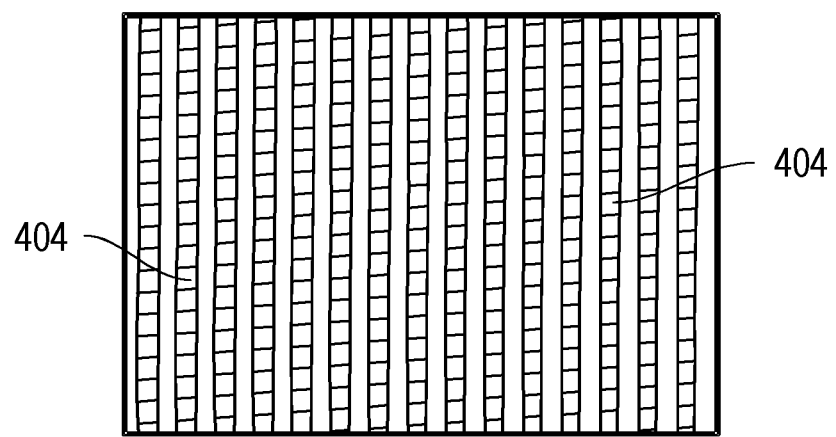
FIG. 4B illustrates the structure of FIG. 4A after a $BCl_3$ plasma treatment.

FIGS. 4A and 4B illustrate the improvement that may be seen from the $BCl_3$ plasma treatment on an EUV photo resist having a 30 nm pitch. As shown in FIG. 4A, the photo resist lines 402 post lithography but pre $BCl_3$ treatment are provided. As shown in FIG. 4B the photo resist lines 404 after $BCl_3$ treatment are provided. The LWR/LER in FIG. 4A is 2.94/4.45 nm before treatment. The LWR/LER in FIG. 4B is 1.92/2.50 nm after treatment. Thus, utilizing the techniques described herein the LWR may be reduced by 30% or more. Similarly, the LER may be reduced by 30% or more.

Some exemplary embodiments described herein are presented in the context of use with EUV photo resist. In one exemplary embodiment, the EUV photo resist may be a standard organic chemically-amplified resist (CAR) EUV photo resist. However, it will be recognized that the concepts described herein may be utilized with a wide range of EUV photo resists. Moreover, the concepts described herein may be utilized with other photo resists including conventional ultraviolet photo resists, ArF photo resists and others. Thus, it will be recognized that though the concepts described herein are provided with regard to EUV lithography techniques, the concepts described herein may be also applicable to other lithography techniques, including those with pitches narrower than those achievable with EUV lithography techniques.

Further, though some exemplary embodiments are described herein with regard to a $BCl_3$ plasma, other plasmas may be utilized. Exemplary plasmas that may be utilized include boron plasmas. Alternatively, the plasma may be formed with a gas compound of boron and a halogen. In one embodiment, the boron and halogen compound may be $B_xCl_y$ and in another embodiment $B_xF_y$. Further, other gases may be utilized in combination with the boron containing gases. For example, an additional gas that is an inert gas such as nitrogen and argon may be added to the plasma, as the plasma is not limited to only having the boron containing gas. Further, the other gases are not limited to inert gases.

In one exemplary embodiment, the $BCl_3$ plasma may be performed with process conditions of 100 to 300 W (and more preferably 100 W) top electrode power, 10 to 100 mT (and more preferably 15 mT) pressure, 10-60° C. (and more preferably 20° C.) electrostatic chuck temperature, and 100 standard cubic centimeters (SCCM) $BCl_3$ gas flow.

Further, though the examples shown herein are illustrated with respect to line patterns, it will be recognized that the concepts described herein may be utilized with hole patterns, block patterns, etc. Thus, it will be recognized that the particular patterns in the photo resist layers shown herein are merely exemplary.

The photo resist treatment techniques described herein may be provided with a wide range of photo lithography structures and process flows. The structures shown herein will be recognized as merely exemplary. Thus, it will be recognized that the structures shown in FIG. 2 are merely exemplary and other layers and combinations of layers may be utilized. For example, one, more than one, or no other lithography layers may be provided between the photo resist layer and the etch target layer. Therefore, it will be recognized that the particular layers and thicknesses shown and described with relation to FIG. 2 are merely exemplary and other layers and/or thicknesses may be utilized. In addition, the etch target layer may overlie other layers of a substrate. The substrate may be any substrate for which the use of patterned features is desirable. In one embodiment, the substrate may be a substrate that has been subject to multiple semiconductor processing steps which yield a wide variety of structures and layers, all of which are known in the substrate processing art, and which may be considered to be part of the substrate. For example, in one embodiment, the substrate may be a semiconductor wafer having one or more semiconductor processing layers formed thereon. In one embodiment, the concepts disclosed herein may be utilized at a back end of line (BEOL) processing step. In another embodiment, the concepts disclosed herein may be utilized at a front end of line (FEOL) processing step.

As mentioned, it will be recognized that the particular stack of intervening lithography layers may vary while still obtaining the benefits of the concepts described herein. Thus, for example, more or less lithography layers may be utilized. For example, an antireflective layer need not be utilized or multiple antireflective layers may be utilized (such as, for example, the use of both an antireflective coating (ARC) layer and a bottom antireflective coating (BARC) layer). Further, the particular composition of each layer may vary and the layers may be deposited in a variety of manners, as would be recognized in the art. Likewise the use of a hard mask layer as shown in FIG. 2 is optional. Further, the techniques described herein may be utilized with any of a wide variety of materials used for the various lithography layers and under layers that are known in the substrate processing art, as the techniques described herein are not limited to particular materials.

Figure 5:
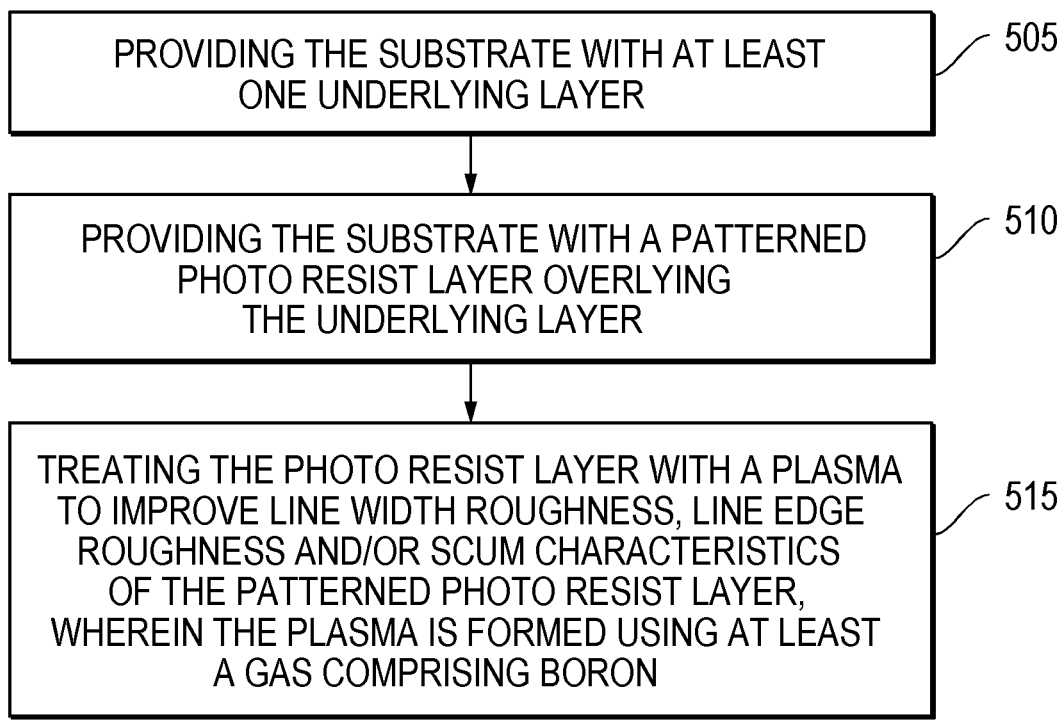
FIGS. 5-7 illustrate exemplary methods for processing a substrate according to the techniques described herein.
Figure 6:
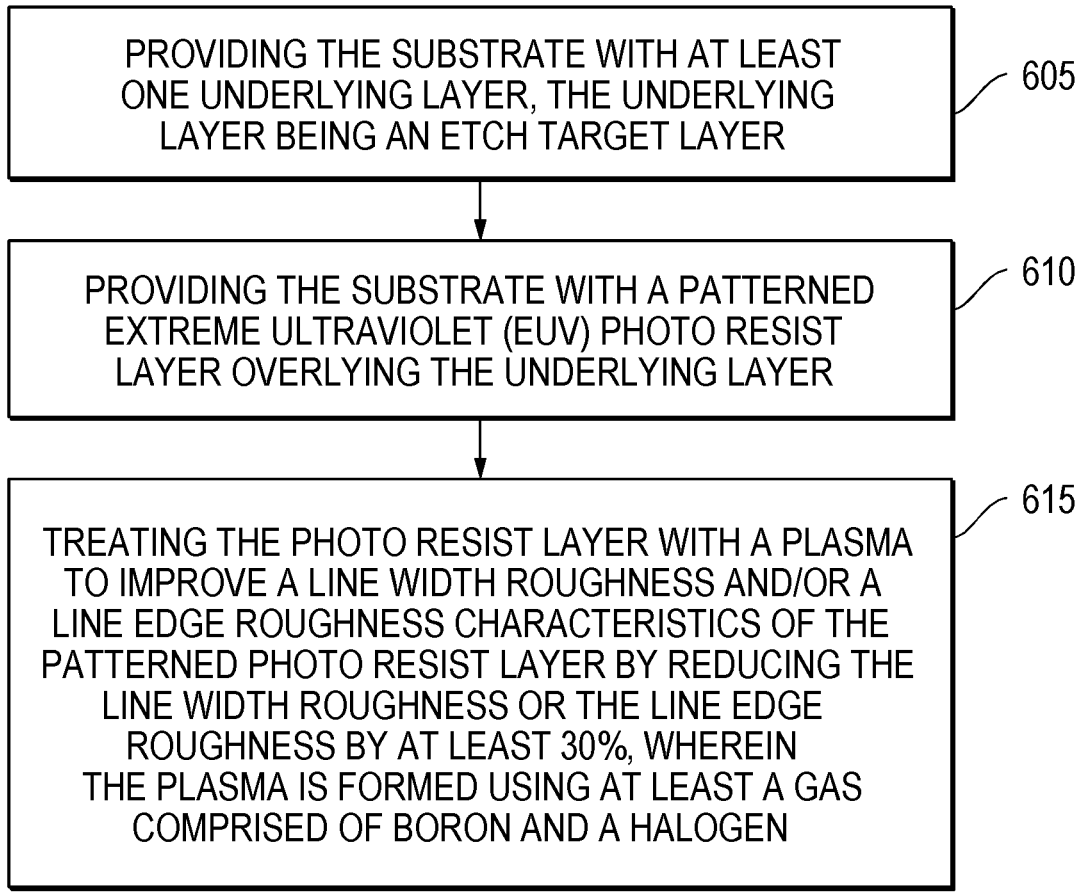
Figure 7:
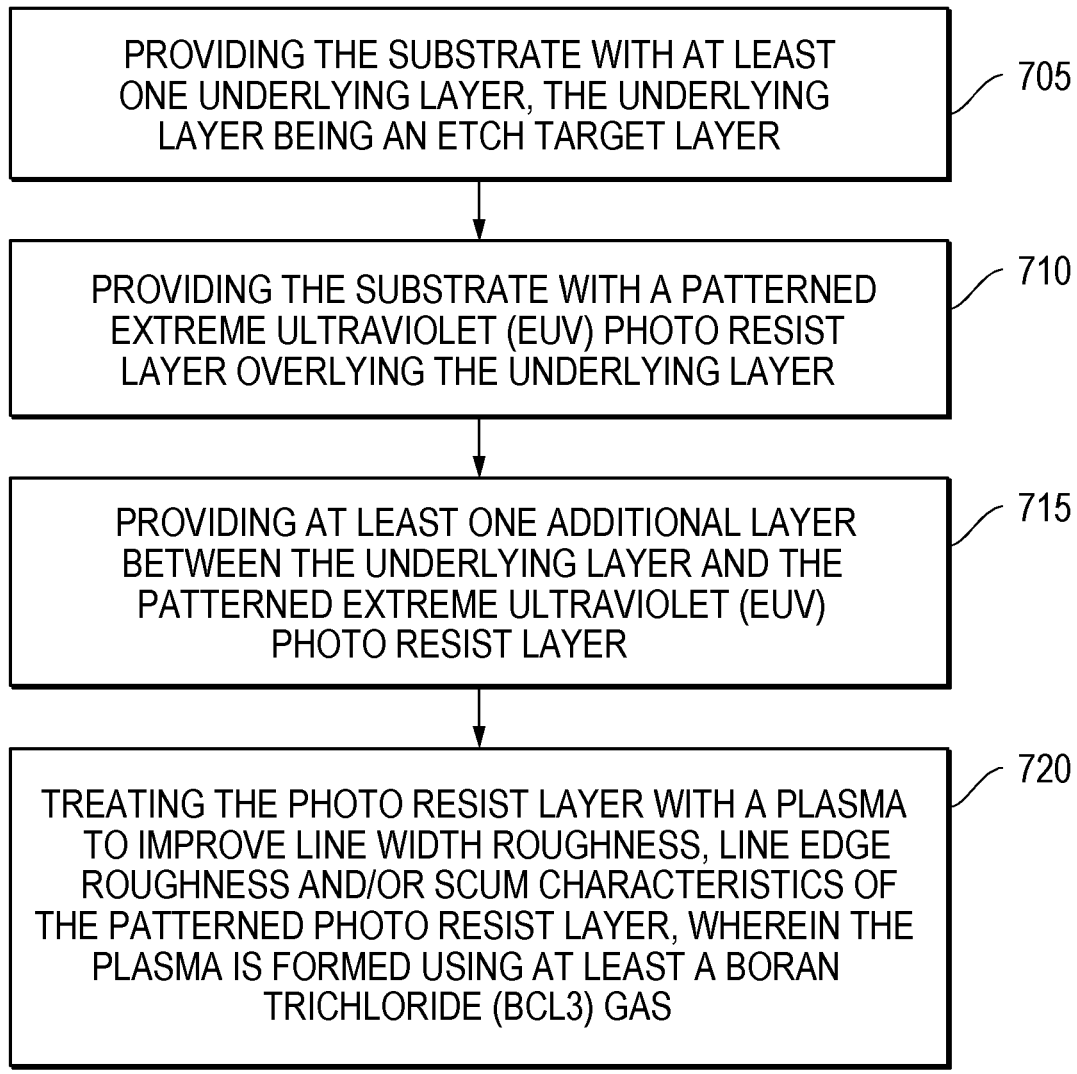

FIGS. 5-7 illustrate exemplary methods for use of the processing techniques described herein. It will be recognized that the embodiments of FIGS. 5-7 are merely exemplary and additional methods may utilize the techniques described herein. Further, additional processing steps may be added to the methods shown in the FIGS. 5-7 as the steps described are not intended to be exclusive. Moreover, the order of the steps is not limited to the order shown in the figures as different orders may occur and/or various steps may be performed in combination or at the same time.

FIG. 5 illustrates a method for processing a substrate. The method comprises step 505 of providing the substrate with at least one underlying layer and step 510 of providing the substrate with a patterned photo resist layer overlying the underlying layer. The method further comprises step 515 of treating the photo resist layer with a plasma to improve line width roughness, line edge roughness and/or scum characteristics of the patterned photo resist layer, wherein the plasma is formed using at least a gas comprising boron.

FIG. 6 illustrates a method for processing a substrate. The method comprises step 605 of providing the substrate with at least one underlying layer, the underlying layer being an etch target layer and step 610 of providing the substrate with a patterned extreme ultraviolet (EUV) photo resist layer overlying the underlying layer. The method further comprises step 615 of treating the photo resist layer with a plasma to improve a line width roughness and/or a line edge roughness characteristic of the patterned photo resist layer by reducing the line width roughness or the line edge roughness by at least 30%, wherein the plasma is formed using at least a gas comprised of boron and a halogen.

FIG. 7 illustrates a method for processing a substrate. The method may comprise step 705 of providing the substrate with at least one underlying layer, the underlying layer being an etch target layer, and step 710 of providing the substrate with a patterned extreme ultraviolet (EUV) photo resist layer overlying the underlying layer. The method also comprises step 715 of providing at least one additional layer between the underlying layer and the patterned extreme ultraviolet (EUV) photo resist layer. The method further comprises step 720 of treating the photo resist layer with a plasma to improve line width roughness, line edge roughness and/or scum characteristics of the patterned photo resist layer, wherein the plasma is formed using at least a boron trichloride ($BCl3$) gas.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method for processing a substrate, the method comprising:
   providing the substrate with at least one underlying layer;
   providing the substrate with a patterned photoresist layer overlying the underlying layer; and
   treating the photoresist layer with a plasma to improve line width roughness, line edge roughness and/or scum characteristics of the patterned photoresist layer,
   wherein the plasma is formed using at least a gas comprising a boron and fluorine compound that is a $B_XF_Y$ gas.

2. The method of claim 1, wherein the patterned photoresist layer is an argon fluoride (ArF) photoresist layer.

3. A method for processing a substrate, the method comprising:
   providing the substrate with at least one underlying layer, the underlying layer being an etch target layer;
   providing the substrate with a patterned extreme ultraviolet (EUV) photoresist layer overlying the underlying layer; and
   treating the photoresist layer with a plasma to improve a line width roughness and/or a line edge roughness characteristic of the patterned photoresist layer by reducing the line width roughness or the line edge roughness by at least 30%,
   wherein the plasma is formed using at least a gas comprising a boron and fluorine compound that is a $B_XF_Y$ gas.

4. A method for processing a substrate, the method comprising:
   providing the substrate with at least one underlying layer, the underlying layer being an etch target layer;

providing the substrate with a patterned extreme ultraviolet (EUV) photoresist layer overlying the underlying layer;

providing at least one additional layer between the underlying layer and the patterned extreme ultraviolet (EUV) photoresist layer; and treating the photoresist layer with a plasma to improve line width roughness, line edge roughness and/or scum characteristics of the patterned photoresist layer, wherein the plasma is formed using at least a gas comprising a boron and fluorine compound that is a $B_XF_Y$ gas.

5. The method of claim 4, wherein the plasma is formed using the boron and fluorine compound and an inert gas.

6. The method of claim 4, wherein the at least one additional layer comprises an antireflective layer or a hard mask layer.

7. The method of claim 4, wherein the line width roughness is reduced by at least 30% by treating the photoresist layer.

8. The method of claim 4, wherein the line edge roughness is reduced by at least 30% by treating the photoresist layer.

\* \* \* \* \*